United States Patent
Chien

[11] Patent Number: 5,956,085
[45] Date of Patent: Sep. 21, 1999

[54] APPARATUS FOR INCREASING THE SAMPLE FREQUENCY OF SCANNING

[75] Inventor: Chun Tsai Chien, Taoyuan, Taiwan

[73] Assignee: Umax Data Systems Inc., Hsinchu, Taiwan

[21] Appl. No.: 08/745,139

[22] Filed: Nov. 7, 1996

[51] Int. Cl.[6] .................................................. H04N 9/04
[52] U.S. Cl. .......................... 348/272; 348/275; 358/512; 358/513
[58] Field of Search ..................................... 348/260, 262, 348/272, 277; 358/482, 483, 513, 514, 512; 250/237 R, 208.1

[56] References Cited

U.S. PATENT DOCUMENTS

| | | | |
|---|---|---|---|
| 4,959,736 | 9/1990 | Mino et al. | 458/471 |
| 5,055,921 | 10/1991 | Usui | 358/512 |
| 5,703,640 | 12/1997 | Miwada | 348/272 |

*Primary Examiner*—Wendy Garber
*Assistant Examiner*—Andrew B. Christensen
*Attorney, Agent, or Firm*—Pennie & Edmonds LLP

[57] ABSTRACT

A charge-coupled device (CCD) scanning apparatus which consists of a plurality of nonsquare crystals is disclosured. By modulating a radio of vertical width to lateral width in the nonsquare crystal, the improved CCD scanning, apparatus can decrease the sample width, increase the sample frequency, therefore, it can reduce distortion and improve the quality of the image.

14 Claims, 4 Drawing Sheets

APPARATUS FOR INCREASING THE SAMPLE FREQUENCY OF SCANNING

BACKGROUND OF THE INVENTION

1. Field of the Invention

The present invention related to an apparatus for increasing the image space frequency, and more particularly to an nonsquare crystal structure for increasing the sample frequency of scanning in a charge-coupled device (CCD) scanning apparatus.

2. Description of the Prior Art

As illustrated in FIG. 1, a light-sensitive device 10 consists of a charge-coupled device (CCD) 12. CCD 12 has three scanning lines, one is red color scanning line (R), another is green color scanning line (G), and the other is blue color scanning line (B). Each of the three scanning lines consists of a plurality of crystals 14, and the three scanning lines are used for scanning and transforming an image into three electrical signals representative of the red portion, green portion, and blue portion of the image, respectively. As illustrated in FIG. 2A, it shows a plane view of the conventional square crystal structure (x=y=1 pixel width), wherein x is the vertical dimension and y is the lateral dimension. The conventional CCD scanning apparatus consists of a plurality of square crystals, and the feature of the square crystal may be a square, a polygon or a circle. Actually, the square crystal is a square structure in the ratio between vertical dimension x and lateral dimension y, and the vertical dimension of the square crystal structure is equal to the lateral dimension of the square crystal structure approximately 1 pixel width. For example, the feature of the square crystal structure of the conventional scanner is square, as illustrated in FIG. 3A, the conventional scanner moves along the forward direction (y direction) at a uniform velocity. As illustrated in FIG. 3B and FIG. 3C, during the conventional scanner with the square crystal structure scanning, a sample Width 32 gotten by a sample uni-integral area 30 is very wide about 2 pixel width. In addition, the image space frequency gotten by the sample integral areas via the theorem such as sample theorem and Fourier transform is limited. Therefore, the limited image space frequency influences the quality of the image. As illustrated in FIG. 4A, if a series of the original image pixel values are "100, 0, 100, 0, . . . ", then, as illustrated in FIG. 4B, the series of the image pixel values will be "50, 50, 50, 50, . . . " in accordance with the result of the image sample integral area calculated after scanning by the conventional scanning apparatus using the square crystal structure(x=y=1 pixel width). Therefore, the conventional scanning apparatus will result in high distortion in the quality of the image.

SUMMARY OF THE INVENTION

It is a primary object of this present invention to provide an improved CCD scanning apparatus for decreasing the sample width, increasing the image space frequency and improving the quality of the image.

Accordingly, the present invention provides a CCD scanning apparatus comprising a plurality of nonsquare crystals (x≠y, y<x=1 pixel width) for decreasing the sample width, increasing the image space frequency, wherein the nonsquare crystal is the rectangular crystal and x is vertical dimension about 1 pixel width and y is lateral dimension in a CCD crystal structure. A multiple of the sample frequency of the present invention apparatus to the sample frequency of the conventional apparatus is modulated, and a ratio of x to y can be calculated in a CCD crystal structure. By this way, a sample width which is gotten by a sample integer area will be decreased, therefore, the apparatus can increase the image space frequency and improve the quality of the image.

DESCRIPTION OF THE PREFERRED EMBODIMENT

Figure 1:
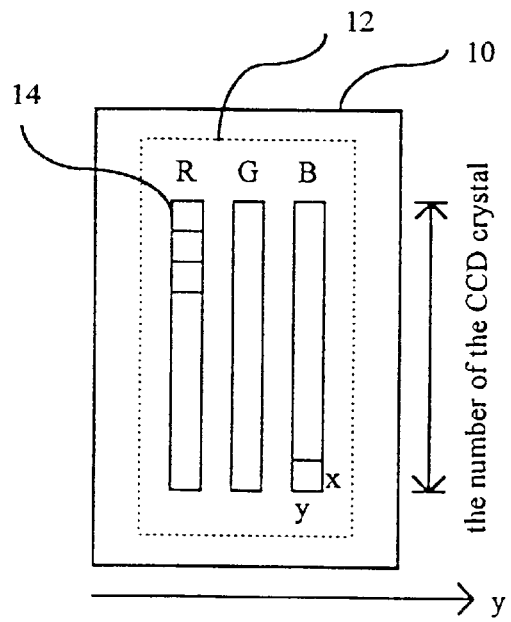
FIG. 1 shows the main structure of a charge-coupled device in a light-sensitive device.
Figure 2A:
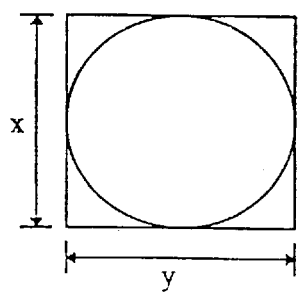
FIG. 2A is a plane view of the conventional square crystal structure.
Figure 2B:
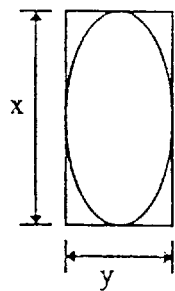
FIG. 2B is a plane view of the present invention nonsquare crystal structure.
Figure 3A:
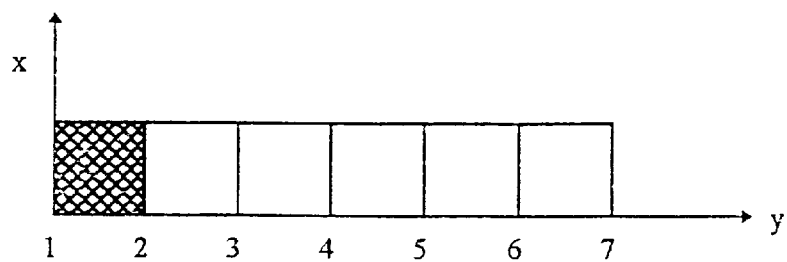
FIG. 3A-FIG. 3B show the image sample integral area of the conventional scanning apparatus using the square crystal structure.
Figure 3B:
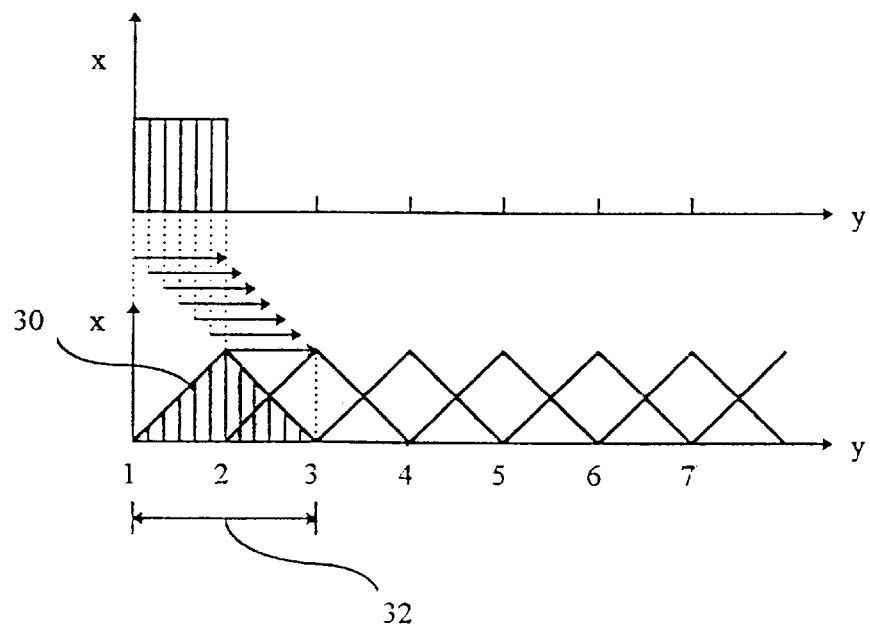
Figure 3C:
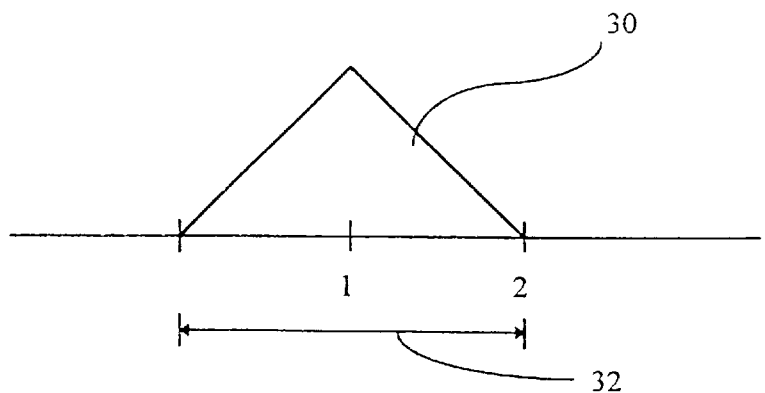
FIG. 3C shows the image sample width in a sample uni-integral area by the conventional scanning apparatus using the square crystal structure.
Figure 4A:
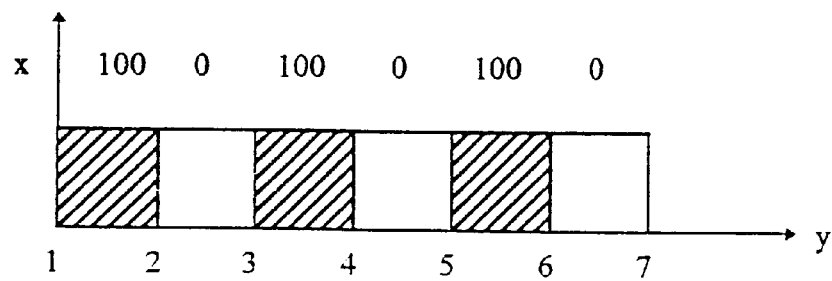
FIG. 4A shows a series of the original image pixel values before scanning.
Figure 4B:
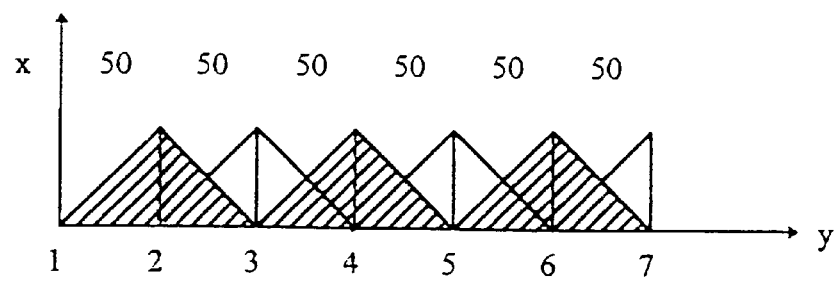
FIG. 4B shows a series of the image pixel values in accordance with the result of the image sample integral area calculated related with the image of FIG. 4A after scanning by the conventional scanning apparatus using the square crystal structure.
Figure 4C:
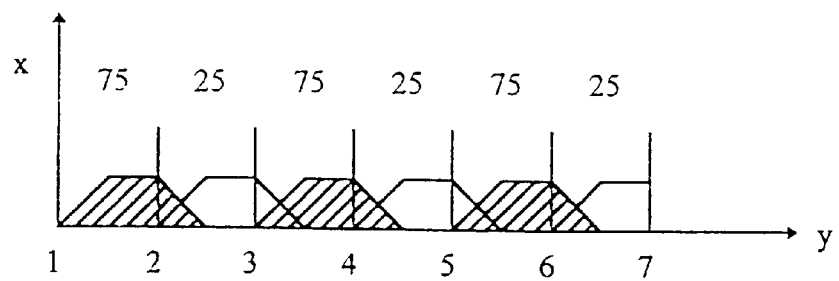
FIG. 4C shows a series of the image pixel values in accordance with the result of the image sample integral area calculated related with the image of FIG. 4A after scanning by the present invention scanning apparatus using the nonsquare crystal structure.
Figure 5A:
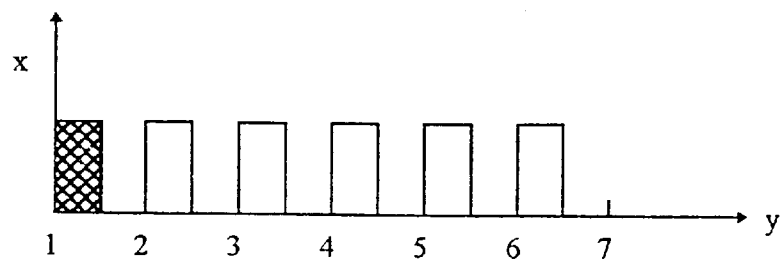
FIG. 5A-FIG. 5B show the image sample integral area of the present invention scanning apparatus using the nonsquare crystal structure.
Figure 5B:
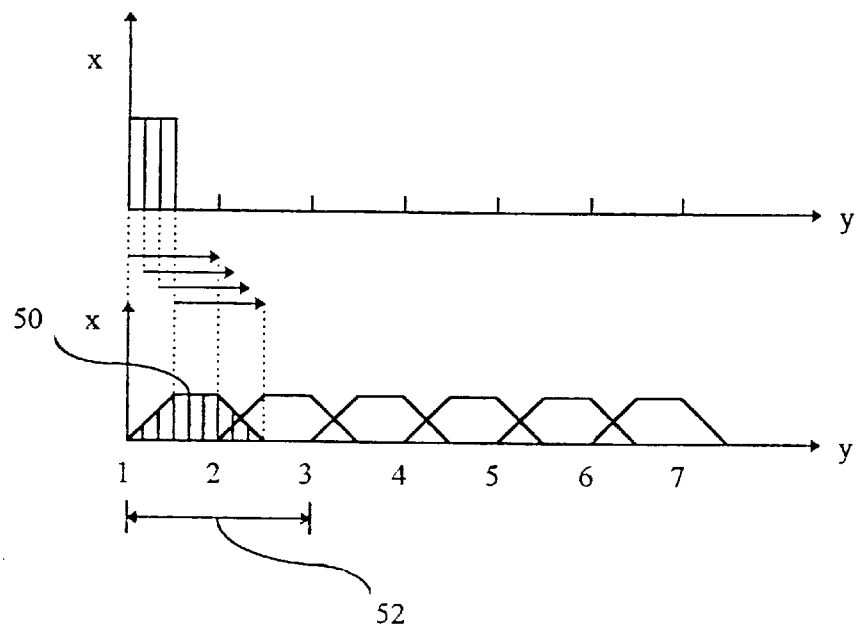
Figure 5C:
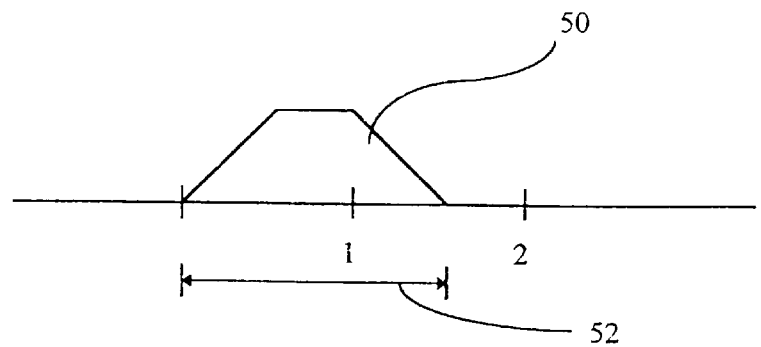
FIG. 5C shows the image sample width in a sample uni-integral area by the present invention scanning apparatus using the nonsquare crystal structure.

As illustrated in FIG. 2B, it shows the present invention CCD nonsquare crystal structure (x≠y, y<x=1 pixel width), wherein x is the vertical dimension about 1 pixel width and y is the lateral dimension, and the feature of the nonsquare crystal may be a rectangle, a polygon or an ellipse. Actually, the nonsquare crystal is a nonsquare structure in the ratio between vertical dimension x and lateral dimension y, and the vertical dimension of the nonsquare crystal structure is wider than the lateral dimension of the nonsquare crystal structure. For example, the feature of the nonsquare crystal structure of the present invention scanner is rectangle, as illustrated in FIG. 5A, the present invention scanner with nonsquare crystal structure (x=2y=1 pixel width) moves along the forward direction (y direction) at a uniform velocity. As illustrated in FIG. 5B and FIG. 5C, during the present invention scanner with nonsquare crystal structure (x=2y=1 pixel width) scanning, a sample width 52 gotten by a sample uniintegral area 50 is decreased. Comparing FIG. 3C and FIG. 5C, the sample width 32 of the conventional CCD crystal structure(x=y=1 pixel width) is about 2 pixel width and the sample width 52 of the present invention CCD crystal structure(x=2y=1 pixel width) is decreased to be about 3/2 pixel width. Accordingly, when the feature of the square crystal structure of the conventional scanner is square and the feature of the nonsquare crystal structure of the present invention scanner is rectangle, as illustrated in FIG. 4A, if a series of the image pixel values are "100, 0, 100, 0, . . . ", then, the series of the image pixel values will be "50, 50, 50, 50, . . . " in accordance with the result of the image sample integral area calculated after scanning by the conventional scanning apparatus using the square crystal structure(x=2y=1 pixel width) shown in FIG. 4B, and the series of the image pixel values will be "75,25,75,25, . . . " in accordance with the result of the image sample integral area calculated after scanning by the present invention scanning apparatus using the nonsquare crystal structure (x=2y=1 pixel width) shown in FIG. 4C. Therefore, the present invention scanning apparatus can improve the quality of the image and reduce distortion.

By the different ratio of x to y in a CCD crystal structure results in the different sample integral area and sample width. When the sample width decreases, the space sample frequency increases by sample theorem and Fourier transform, then, the image space frequency will increase and the quality of the image will be improved. Accordingly, when the feature of the square crystal structure of the conventional scanner is square and the feature of the nonsquare crystal structure of the present invention scanner is rectangle, if the ratio of x to y is 2 in the CCD crystal structure in the present invention, wherein x is equal to 1 pixel width, the sample width of the present invention apparatus will be ((3/2)/2)=3/4 times shorter than that of the convention apparatus with the square crystal structure (x=y=1 pixel width). Therefore, the space sample frequency of the present invention apparatus will increase to be (1/(3/4))=4/3 times wider than that of the convention apparatus.

Accordingly by the present invention technique, if the ratio of x to y is n in the CCD crystal structure in the present invention, wherein x is equal to 1 pixel width, the sample width of the present invention apparatus will be ((n+1)/2n) times shorter than that of the convention apparatus with square crystal structure (x=y=1 pixel width), and the space sample frequency of the present invention apparatus will increase to be (2n/(n+1)) times wider than that of the convention apparatus, wherein n≧1 and n is positive real. Namely, By modulating a multiple (2n/(n+1)) of the sample frequency of the present invention apparatus to the sample frequency of the conventional apparatus, and a ratio n of x to y can be calculated in a CCD crystal structure. Therefore, an improved CCD scanning apparatus with the nonsqare crystal structure will be utilized for improving the quality of the image.

Although specific embodiments have been illustrated and described it will be obvious to those skilled in the art that various modification may be made without departing from the spirit which is intended to be limited solely by the appended claims.

What is claimed is:

1. Scan apparatus for increasing a sampling frequency, comprising:

red color scan means for scanning and transforming an image into a first electrical signal representative of the red portion of the image, said red color scan means comprising a plurality of nonsquare charge-coupled device elements;

green color scan means for scanning and transforming the image into a second electrical signal representative of the green portion of the image, said green color scan means comprising a plurality of nonsquare charge-coupled devices element; and blue color scan means for scanning and transforming the image into a third electrical signal representative of the blue portion of the image, said blue color scan means comprising a plurality of nonsquare charge-coupled device elements, wherein said plurality of nonsquare charge-coupled device elements are nonsquare charge-coupled device crystals, a vertical dimension of said nonsquare charge-coupled device crystal is wider than a lateral dimension of said nonsquare charge-coupled device crystal, said vertical dimension being n times wider than said lateral dimension in one of said plurality of nonsquare charge-coupled device crystals, wherein said n is a positive real number, a sample width of said apparatus is (n+1)/2n times shorter than a sample width using square crystal, a sample frequency of said apparatus being 2n/(n+1) times wider than a sample frequency using square crystal.

2. The apparatus according to claim 1, a feature of said nonsquare charge-coupled device crystal is a polygon.

3. The apparatus according to claim 1, a feature of said nonsquare charge-coupled device crystal is an ellipse.

4. The apparatus according to claim 1, wherein said vertical dimension is 2 times wider than said lateral dimension.

5. The apparatus according to claim 4, wherein of a sample width of said apparatus is ¾ times shorter than a sample width using square crystal.

6. The apparatus according to claim 4, wherein a sample frequency of the apparatus is 4/3 times wider than a sample frequency using square crystal.

7. Scan apparatus for increasing a sampling frequency, comprising:

red color scan means for scanning and transforming an image into a first electrical signal representative of the red portion of the image, said red color scan means comprising a plurality of nonsquare charge-coupled device crystals, a vertical dimension of said nonsquare charge-coupled device crystal being n times wider than a lateral dimension of said nonsquare charge-coupled device crystal, said n being positive real;

green color scan means for scanning and transforming the image into a second electrical signal representative of the green portion of the image, said green color scan means comprising a plurality of nonsquare charge-coupled device crystals, a vertical dimension of said nonsquare charge-coupled device crystal being n times wider than a lateral dimension of said nonsquare charge-coupled device crystal, said n being positive real; and blue color scan means for scanning and transforming the image into a third electrical signal representative of the blue portion of the image, said blue color scan means comprising a plurality of nonsquare charge-coupled device crystals, a vertical dimension of said nonsquare charge-coupled device crystal being n times wider than a lateral dimension of said nonsquare charge-coupled device crystal, said n being positive real, wherein a sample width of said apparatus is (n+1)/2n times shorter than a sample width using square crystal.

8. The apparatus according to claim 7, a feature of said nonsquare charge-coupled device crystal is a rectangle.

9. The apparatus according to claim 7, a feature of said nonsquare charge-coupled device crystal is a polygon.

10. The apparatus according to claim 7, a feature of said nonsquare charge-coupled device crystal is an ellipse.

11. The apparatus according to claim 7, wherein a sample frequency of said apparatus is 2n/(n+1) times wider than a sample frequency using square crystal.

12. The apparatus according to claim 7, wherein said vertical dimension is 2 times wider than said lateral dimension.

13. The apparatus according to claim 12, wherein of a sample width of said apparatus is ¾ times shorter than a sample width using square crystal.

14. The apparatus according to claim 12, wherein a sample frequency of the apparatus is 4/3 times wider than a sample frequency using square crystal.

* * * * *